(12) United States Patent
Chan et al.

(10) Patent No.: US 7,795,150 B2
(45) Date of Patent: Sep. 14, 2010

(54) METAL CAPPING OF DAMASCENE STRUCTURES TO IMPROVE RELIABILITY USING HYPER SELECTIVE CHEMICAL-MECHANICAL DEPOSITION

(75) Inventors: Elvis M. Chan, Rocklin, CA (US);
Bradley S. Withers, Folsom, CA (US)

(73) Assignee: Renesas Electronics America Inc., Santa Clara, CA (US)

( * ) Notice: Subject to any disclaimer, the term of this patent is extended or adjusted under 35 U.S.C. 154(b) by 132 days.

(21) Appl. No.: 10/998,467

(22) Filed: Nov. 29, 2004

(65) Prior Publication Data

US 2006/0115976 A1    Jun. 1, 2006

(51) Int. Cl.
*H01L 21/3205* (2006.01)
*H01L 21/304* (2006.01)

(52) U.S. Cl. ...................... 438/695; 438/687
(58) Field of Classification Search ............... 438/695, 438/692, 678, 687; 257/E21.174, E21.23
See application file for complete search history.

(56) References Cited

U.S. PATENT DOCUMENTS

| | | | | |
|---|---|---|---|---|
| 5,350,484 A | * | 9/1994 | Gardner et al. | 438/669 |
| 5,470,789 A | * | 11/1995 | Misawa | 438/643 |
| 6,110,648 A | * | 8/2000 | Jang | 430/312 |
| 6,348,731 B1 | | 2/2002 | Ashley et al. | 257/751 |
| 6,426,294 B1 | * | 7/2002 | Hirabayashi et al. | 438/690 |
| 6,468,906 B1 | | 10/2002 | Chan et al. | 438/687 |
| 6,566,242 B1 | * | 5/2003 | Adams et al. | 438/622 |
| 6,706,422 B2 | * | 3/2004 | Inoue et al. | 428/680 |
| 6,709,563 B2 | * | 3/2004 | Nagai et al. | 205/123 |
| 6,815,357 B2 | * | 11/2004 | Homma et al. | 438/695 |
| 7,084,059 B2 | * | 8/2006 | Thomas et al. | 438/674 |
| 2004/0219298 A1 | * | 11/2004 | Fukunaga et al. | 427/304 |
| 2006/0115976 A1 | * | 6/2006 | Chan et al. | 438/618 |

FOREIGN PATENT DOCUMENTS

JP          10-22285      *    1/1998

OTHER PUBLICATIONS

Translation of JP 10-22285 from PAJ.*

* cited by examiner

*Primary Examiner*—Mary Wilczewski
(74) *Attorney, Agent, or Firm*—Campbell Stephenson LLP

(57) ABSTRACT

A method for improving the reliability of integrated circuits. In one embodiment, the method includes forming a dielectric layer on a semiconductor wafer. A trench is then formed in the dielectric. Thereafter, a conductive interconnect is formed within the trench, wherein the conductive interconnect comprises copper. The conductive interconnect is then etched using an acidic solution. Lastly, a conductive layer is formed on an exposed surface of the etched conductive interconnect.

9 Claims, 7 Drawing Sheets

METAL CAPPING OF DAMASCENE STRUCTURES TO IMPROVE RELIABILITY USING HYPER SELECTIVE CHEMICAL-MECHANICAL DEPOSITION

BACKGROUND OF THE INVENTION

Thousands of sub-micron devices (e.g., logic gates) in ultra large scale integrated (ULSI) circuits are in data communication with each other via interconnects. As device geometry continues to scale down for ULSI circuits, there is a growing demand for device interconnects with smaller pitch and higher conductivity. Copper interconnects are now being used to meet this demand and to provide other benefits such as high conductivity and high electromigration resistance.

ULSI circuits are formed on semiconductor wafers using well known tools and processes. FIGS. 1A-1E illustrate cross-sectional views of a portion of an exemplary semiconductor wafer 10 during the manufacture of integrated circuits thereon. More particularly, FIG. 1A shows a portion a dielectric 12 formed on wafer 10. FIG. 1A also shows trenches 14 formed within dielectric 12. Although not shown, the bottom and sides of trenches 14 are lined by a thin barrier of tantalum or tantalum nitride to prevent copper electromigration after trenches 14 are filled with copper to create copper interconnects.

FIG. 1B shows wafer 10 after a layer of copper 16 has been deposited on dielectric 12. Copper fills trenches 14 to eventually form copper interconnects. After formation of copper layer 16, wafer 10 in FIG. 1B undergoes chemical-mechanical polishing (CMP) using a conventional CMP tool. FIG. 1C shows that most of the copper layer 16 deposited on dielectric 12 is removed by chemical-mechanical polishing. The remaining copper forms copper interconnects 20.

Chemical-mechanical polishing recesses surfaces 22 of copper interconnects 20 below surface 24 of dielectric 12 as seen in FIG. 1C. The recessing effect of chemical-mechanical polishing can vary across the surfaces 22 of copper interconnects 20 as shown in FIG. 1C. More particularly, interconnects 14 are shown recessed below the surface of dielectric layer 12 more so towards the middle of the copper interconnects than at the ends of the interconnects, thus creating a dish like surface 22 on copper interconnects 14.

In the past, dielectric materials, such as silicon nitride, silicon dioxide, silicon carbide, or silicon carbon nitride, were used to cap copper interconnects such as those shown within FIG. 1C. The copper interconnects were capped with a dielectric material for several reasons; the dielectric cap acts as an etch-stopping layer, a copper diffusion barrier, or a copper corrosion barrier. In all cases, the added dielectric layer needs to be relatively thick to be effective. Unfortunately, a thick dielectric cap formed over the copper interconnects creates a structure with unacceptably high capacitance and is also prone to electromigration (EM) and stress migration (SM) failures due to interfacial issues between the dielectric and the copper. To address the high capacitance and reliability problems, dielectric caps have been replaced with more electrically conductive caps formed out of refractory metals or alloys. Cobalt is a conductive material commonly used to create caps over copper interconnects.

Three main techniques are used to cap copper interconnects with cobalt: (1) selective metal chemical vapor deposition (CVD); (2) selective electroless plating, and; (3) blanket deposition (CVD or plating) followed by CMP planarization. Unfortunately, these prior art techniques can reduce reliability of resulting integrated circuits. To illustrate, FIGS. 1D and 1E show operational aspects of the last technique, blanket deposition followed by CMP. In FIG. 1D, a cobalt layer 26 is formed on the exposed surfaces of dielectric 12 and copper interconnects 20 of the wafer 10 shown in FIG. 1C using conventional CVD. Thereafter, wafer 10 undergoes a second mechanical-chemical polishing. FIG. 1E shows wafer 10 after excess cobalt is removed via the chemical-mechanical polishing, resulting in cobalt caps 30 on copper interconnects 20. It is noted that the capacitance produced by the structures shown within FIG. 1E is less than the capacitance produced by copper interconnects with a dielectric cap formed thereon and should also have improved reliability.

Chemical-mechanical polishing recesses copper interconnects 20 below the surface of dielectric 12 as shown in FIG. 1C. Proper recessing is needed to create effective, more reliable cobalt caps (e.g., caps 30 in FIG. 1E) on copper interconnects 20. The recesses resulting from chemical-mechanical polishing is highly dependent on the geometry of the copper interconnects. More particularly, the recessing of copper interconnects below the dielectric surface is more dominant in large patterns of copper interconnects than in smaller or more density-packed patterns. In other words, a sufficiently deep recess is created in the copper when the width of the copper interconnect is substantially large and/or when the distance between copper interconnects is substantially large.

The depth of the recess can vary by pattern density. For copper interconnects with small widths or for copper interconnects closely positioned next to each other, the copper interconnect recesses created during chemical-mechanical polishing may not be sufficient. To illustrate, FIGS. 2A and 2B show cross-sectional views of a wafer 30 during manufacture of integrated circuits thereon. Wafer 30 shown in FIG. 2A includes dielectric 32, copper interconnects 34 and recesses 36, wherein the recesses 36 were created during chemical-mechanical polishing to remove excess copper from the surface of dielectric layer 32. Presuming the width of the copper interconnects 34 is smaller than the widths of copper interconnects 20 shown within FIGS. 1C-1E and/or presuming the distances between copper interconnects 34 is smaller than the distances of copper interconnects 20, the recesses 36 created in copper interconnects 34 by chemical-mechanical polishing are substantially smaller than the recesses shown within FIG. 1C.

The small recesses shown in FIG. 2A can create problems. To illustrate, after chemical-mechanical polishing, a layer of cobalt is deposited on wafer 30. Wafer 30 is then subjected to chemical-mechanical polishing. FIG. 2B shows wafer 30 after cobalt deposition and subsequent chemical-mechanical polishing. As can be seen, cobalt caps 40 are formed on copper interconnects 34. Cobalt caps 40, however, do not completely cover copper interconnects 34. As a result, portions of copper interconnects 34 may experience subsequent corrosion or other adverse effects.

FIGS. 3A and 3B illustrate another adverse effect that can occur with narrow or closely-spaced copper interconnects. More particularly, FIGS. 3A and 3B show cross-sectional views of a portion of an exemplary wafer 50 during manufacture of integrated circuits thereon. FIG. 3A shows wafer 50 after chemical-mechanical polishing to remove excess copper deposited on the surface of dielectric 52. Sometimes, as can be seen in FIG. 3A, chemical-mechanical polishing removes a portion of the dielectric between the copper interconnects 54 to create a recessed surface 56 on dielectric 52. Removal of dielectric between copper interconnects often occurs when the copper interconnects are densely packed. The copper interconnects 54 in FIG. 3A are more densely packed than the copper interconnects 20 shown in FIG. 1C, or in other words the distances between copper interconnects 54, as shown in FIG. 3B, is less than the distances between copper interconnects 20. FIG. 3B shows the result of depositing a cobalt layer on wafer 50 and subsequently removing excess cobalt during a second chemical-mechanical polishing. In FIG. 3B, it can be seen that the remaining cobalt creates a conductive path between and thus shorts copper interconnections 54.

Selective metal CVD or selective electroless plating may also create problems when capping copper interconnects. These problems are illustrated with reference to FIGS. 4A-4C, which show cross-sectional views of a portion of an exemplary wafer 60 during manufacture of integrated circuits thereon. Wafer 60 includes copper interconnects 64 retained in trenches of dielectric 62 after chemical-mechanical polishing to remove excess copper from the dielectric surface. During selective metal CVD or selective electroless plating, cobalt will deposit preferentially on the copper interconnect surface. FIG. 4B shows a result of selective CVD or electroless plating deposition of cobalt to form cobalt caps 70 over copper interconnects 64. As can be seen in FIG. 4B, cobalt caps 70 when formed may extend over and cover portions of dielectric 62. The overhang or the portions of cobalt caps 70 extending over the dielectric 62 could lead to electrical leakage problems. Additionally, some cobalt may also deposit on defects or contamination on the dielectric surface. FIG. 4C shows deposits 72 of cobalt that form on defects (not shown) in the surface of dielectric 62. Cobalt deposits 72 may also lead to electrical leakage problems.

SUMMARY OF THE INVENTION

A method for improving the reliability of integrated circuits. In one embodiment, the method includes forming a dielectric layer on a semiconductor wafer. A trench is then formed in the dielectric. Thereafter, a conductive interconnect is formed within the trench, wherein the conductive interconnect comprises copper. The conductive interconnect is then etched using an acidic solution. Lastly, a conductive layer is formed on an exposed surface of the etched conductive interconnect.

BRIEF DESCRIPTION OF THE DRAWINGS

The present invention may be better understood in its numerous objects, features, and advantages made apparent to those skilled in the art by referencing the accompanying drawings.

The use of the same reference symbols in different drawings indicates similar or identical items.

DETAILED DESCRIPTION

The present invention provides a method for selective capping of an interconnect formed on a semiconductor wafer. For purposes of explanation, the interconnect will be formed of copper and the cap will take form in a metal such as cobalt, it being understood that the present invention should not be limited thereto. Circuits manufactured using the disclosed method should have improved device reliability. In one embodiment, the critical steps of the method can be performed on a single tool such as a conventional CMP tool. In other embodiments, steps of the method can be performed on two or more tools.

Figure 5A:
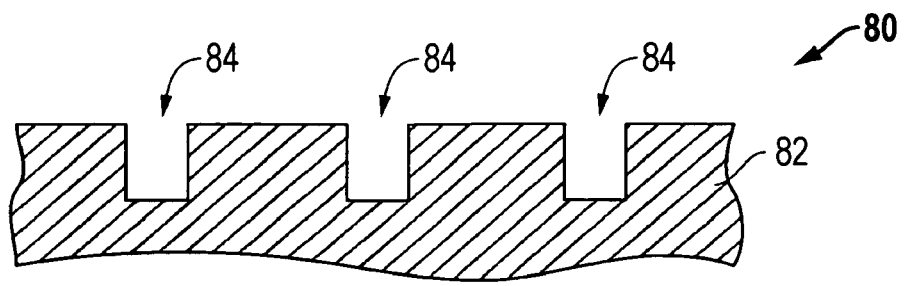
FIG. 5A is a cross-sectional view of a portion of a semiconductor wafer.
Figure 5B:
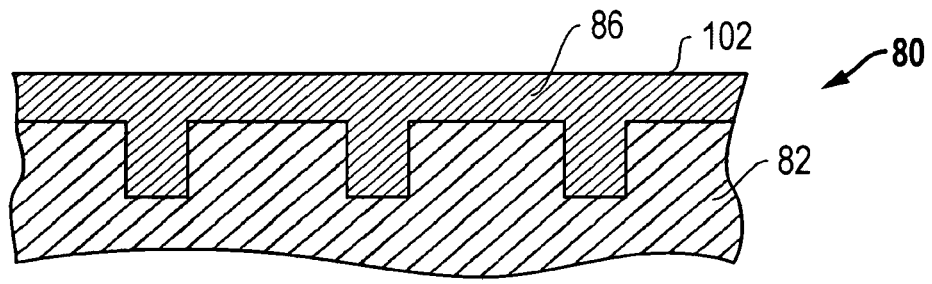
FIG. 5B shows the semiconductor wafer of FIG. 5A after formation of a copper layer thereon.

FIGS. 5A-5E illustrate relevant aspects of one embodiment of the present invention. FIGS. 5A-5E show cross-sectional views of a portion of wafer 80 during the manufacture of integrated circuits thereon. FIG. 5A shows wafer 80 consisting of a layer of dielectric 82. Trenches 84 are formed in dielectric 82. The trenches 84 are configured to receive copper interconnects. Although not shown, trenches 84 are lined on the bottom and sides by a thin barrier of metal such as tantalum nitride to prevent copper electromigration. Copper electromigration barriers of different materials are contemplated. After formation of the electromigration barriers, a layer of copper 86 is deposited on dielectric 82 using conventional techniques. It is noted that a layer of material other than copper can be formed on dielectric 82. For example, a layer of aluminum with copper, aluminum with silicon and copper, other materials that contain copper, a copper alloy, conductive materials that do not contain copper, may be formed on dielectric layer 82. Again, the present invention will be described with reference to a copper layer 86. As shown in FIG. 5B, copper layer 86 extends into and fills trenches 84. Wafer 80 in FIG. 5B is then subjected to chemical-mechanical polishing to remove excess copper from the surface of dielectric 82.

Figure 6:
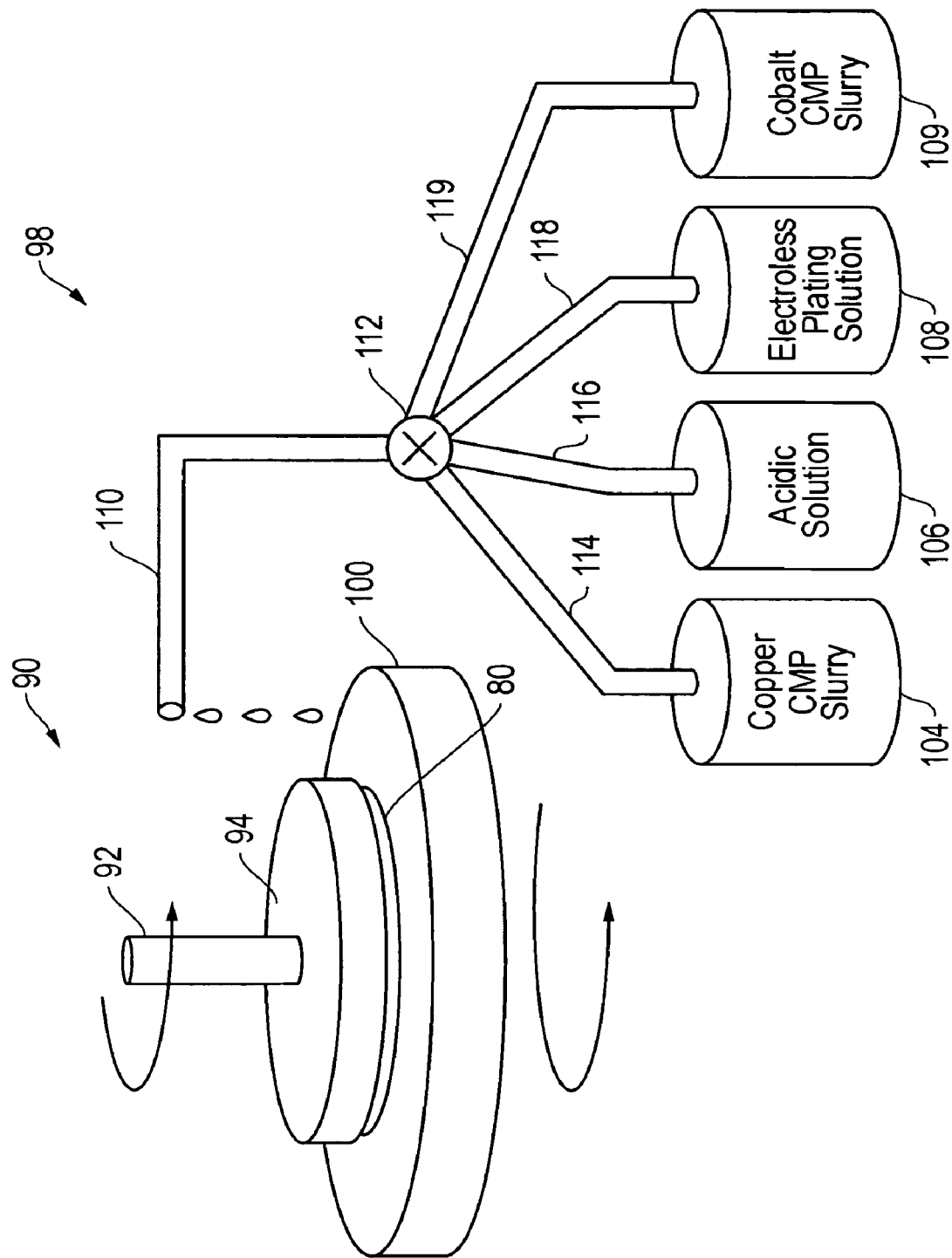
FIG. 6 is a block diagram of a CMP tool employing one embodiment of the present invention.

FIG. 6 illustrates relative components of an exemplary CMP tool 90 that can perform chemical-mechanical polishing on wafer 80 to remove excess copper and perform other functions more fully described below. CMP tool 90 includes a spindle 92 coupled to a wafer carrier 94. Wafer carrier 94 is configured to receive semiconductor wafer 80 of FIG. 5B. Additionally, CMP tool 90 includes a platen or polishing pad 100. Wafer 80 is mounted onto carrier wafer 94 so that surface 102 of copper layer 86 faces and subsequently engages polishing pad 100. CMP tool 90 includes a source (i.e., reservoir) 104 containing a CMP slurry for removing excess copper from the surface of dielectric 82, a source 106 containing an acidic solution, a source 108 containing electroless plating solution, and a source 109 containing a slurry for removing excess cobalt from the surface of dielectric 82. Components of an exemplary electroless plating solution in source 108 may include cobalt in ionic form and some type of reducing agent such as hypophosphite or DMAB. Enthone is one company that makes an electroless plating solution that could be employed in the present invention. Enthone is a business of Cookson Electronic PWB Materials & Chemistry. The slurry contained in source 109 may be the same type of slurry used to remove tungsten from the surface of a semiconductor wafer during conventional chemical-mechanical polishing.

Sources 104-109 are in fluid communication with a conduit 110 via valve 112 and conduits 114-119, respectively. Valve 112 selectively passes fluid from one of the sources 104-109 to conduit 110 and subsequently onto polishing pad 100. Spindle 92 is coupled to a motor (not shown). The motor rotates wafer carrier 94 via spindle 92. Although not shown, polishing pad 100 is also coupled to a motor for rotating polishing pad 100. Typically, wafer carrier 94 and polishing pad 100 are rotated at different rates but in the same direction. Wafer carrier 94 rotates wafer 80 while wafer 80 engages polishing pad 100 and while fluid is applied to polishing pad 100 via the chemical delivery system 98. Fluids provided to the rotating polishing pad 100 are subsequently applied to the wafer 80 as the wafer 80 is rotated against polishing pad 100.

Figure 5C:
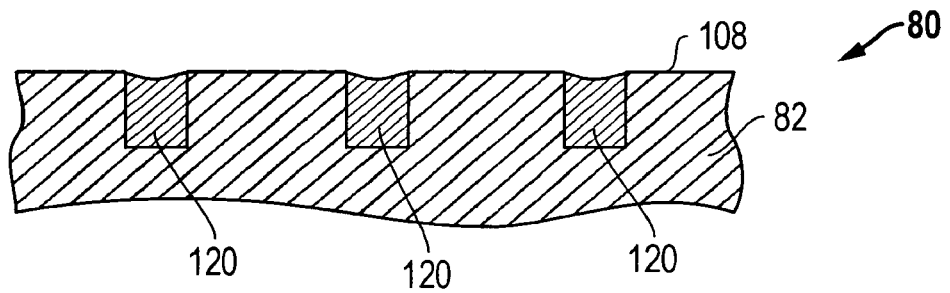
FIG. 5C shows the semiconductor wafer of FIG. 5B after chemical-mechanical polishing.

Wafer 80 shown in FIG. 5B, is mounted to wafer carrier 94. Thereafter, CMP tool 90 performs chemical-mechanical polishing of copper layer 86 using CMP slurry from source 104. Again, the combinational effect of rotating wafer 80 on polishing pad 100 as CMP slurry is applied thereto, removes most of the copper layer 86 formed on dielectric 82, while leaving copper in trenches 84. FIG. 5C shows wafer 80 of FIG. 5B after chemical-mechanical polishing. The copper remaining in trenches 84 form copper interconnects 120. The chemical-mechanical polishing may recess copper wire interconnects 120 below the surface 108 of dielectric layer 82 to create a dishlike surface 122.

Figure 5D:
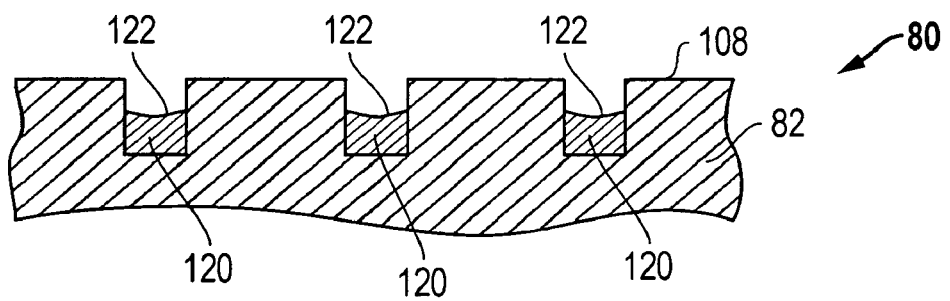
FIG. 5D shows the semiconductor wafer of FIG. 5C after etching the copper interconnects with an acidic solution.

After chemical-mechanical polishing, an acidic solution from source 106 is applied to wafer 80 in FIG. 5C. The acidic solution may take form in $HNO_3/H_2O$, $HCL/KClO_3/H_2O$, or heated $HCl/H_2O$. Other acidic solutions are contemplated for etching copper interconnects 120. The acidic solution etches the copper interconnects 120, but will not substantially affect the dielectric material 82. Recesses 122 are formed or deepened in the copper interconnects 120 after application of the acidic solution, as shown in FIG. 5D. In one embodiment, the acidic solution can be applied to wafer 80 while wafer 80 is still attached to carrier wafer 94. In this embodiment, the acidic solution is provided by source 106 to polishing pad 100 via delivery system 98. It is noted that the acidic solution can be applied to the exposed surfaces of integrated circuit 80 while wafer 80 is rotated by carrier 94. Wafer 80 may or may not engage polishing pad 100 while the acidic solution is applied to the exposed surface of wafer 80. In another embodiment, wafer 80 is removed from CMP tool 90 before an acidic solution is applied to the exposed dielectric and copper interconnect surfaces.

Figure 1A:
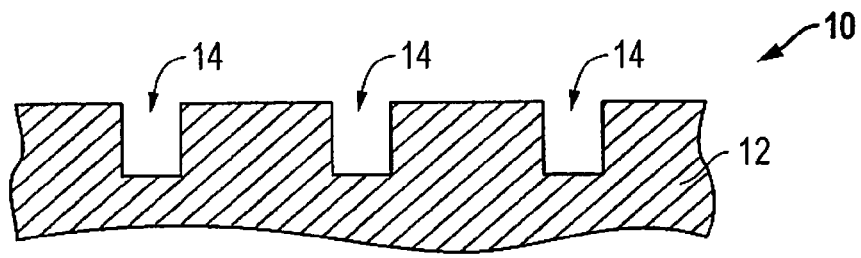
FIG. 1A is a cross-sectional view of a portion of a semiconductor wafer.
Figure 1B:
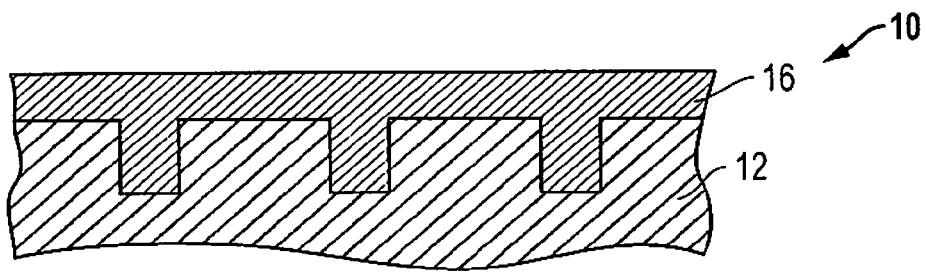
FIG. 1B shows the semiconductor wafer of FIG. 1B after formation of a copper layer thereon.
Figure 1C:
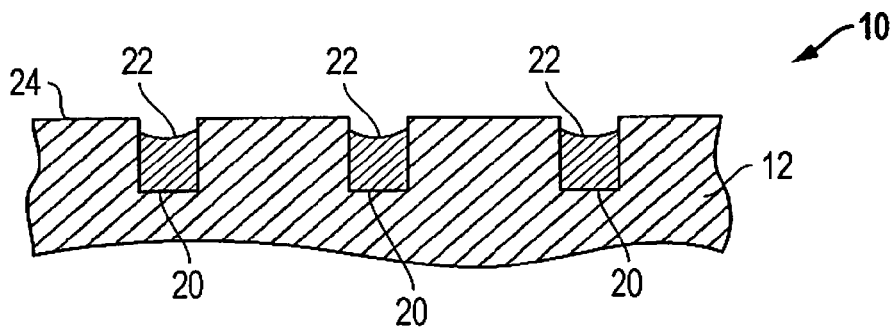
FIG. 1C shows the semiconductor wafer of FIG. 1B after chemical-mechanical polishing.
Figure 1D:
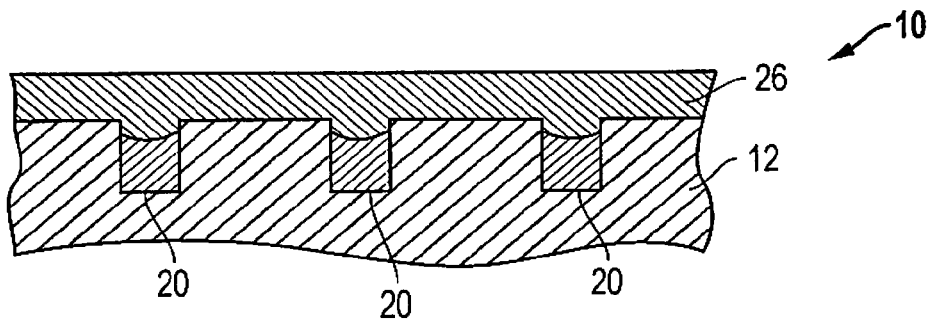
FIG. 1D shows the semiconductor wafer of FIG. 1C after formation of a blanket cobalt layer thereon.
Figure 1E:
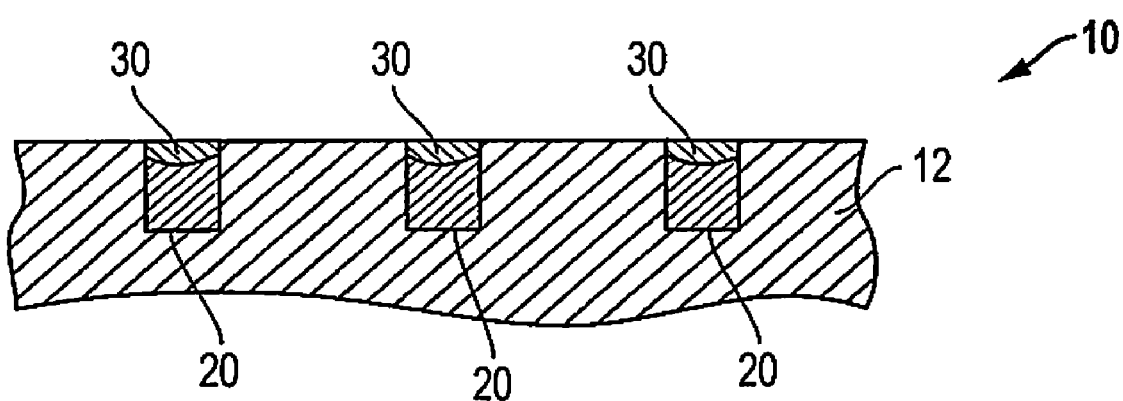
FIG. 1E shows the semiconductor wafer of FIG. 1D after chemical-mechanical polishing.
Figure 2A:
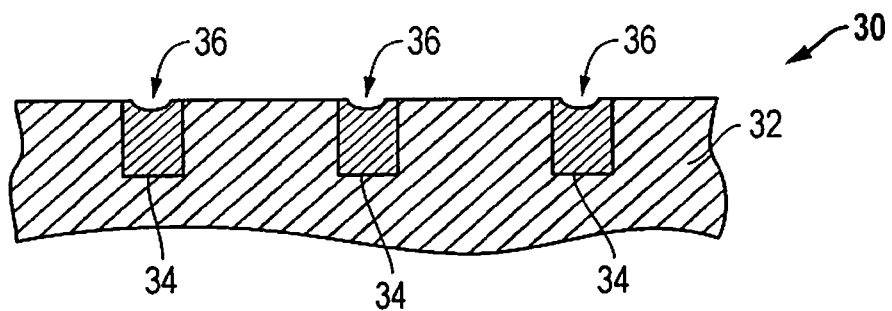
FIG. 2A is a cross-sectional view of a portion of a semiconductor wafer having recessed copper interconnects formed therein.
Figure 2B:
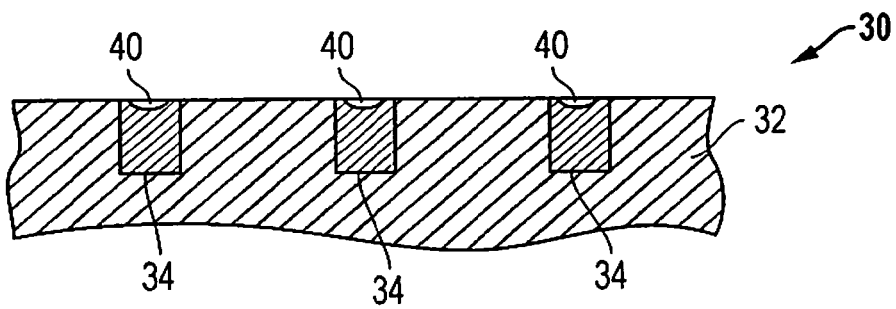
FIG. 2B shows the semiconductor wafer of FIG. 2A after formation of cobalt caps in the recesses of the copper interconnects.
Figure 3A:
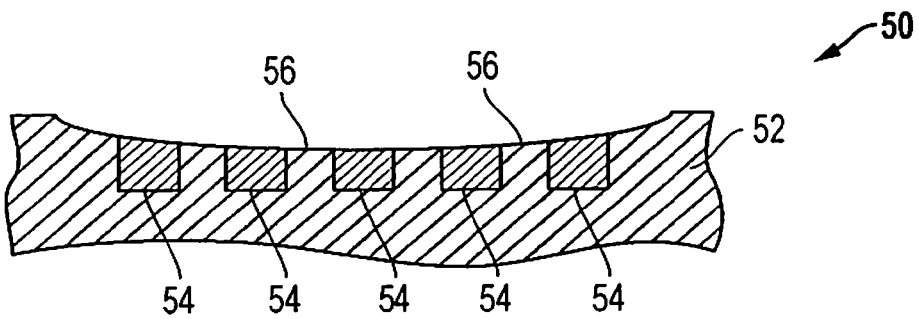
FIG. 3A is a cross-sectional view of a portion of a semiconductor wafer having copper interconnects formed therein.
Figure 3B:
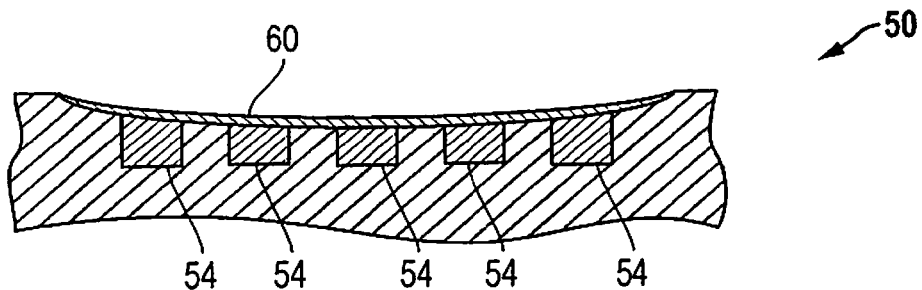
FIG. 3B shows the semiconductor wafer of FIG. 3A after formation of cobalt layer.
Figure 4A:
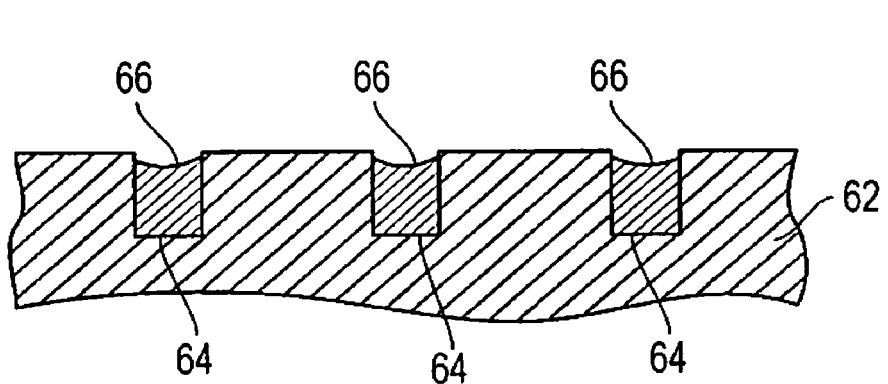
FIG. 4A is a cross-sectional view of a portion of a semiconductor wafer having recessed copper interconnects formed therein.
Figure 4B:
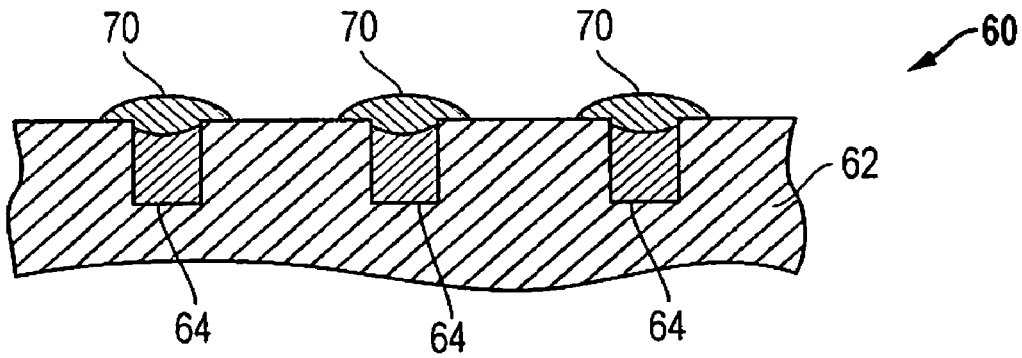
FIG. 4B shows the semiconductor wafer of FIG. 4A after formation of cobalt caps over the copper interconnects.
Figure 4C:
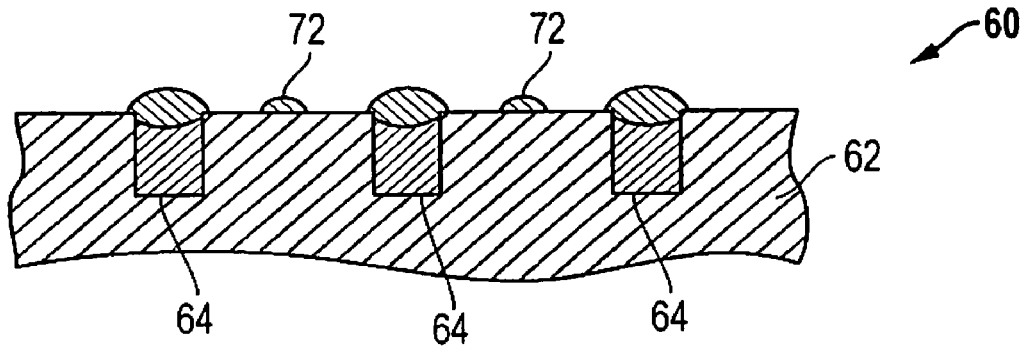
FIG. 4C also shows the semiconductor wafer of FIG. 4A after formation of cobalt caps over the copper interconnects.

After formation or the deepening of recesses 122, cobalt caps can be formed on copper wire interconnects 120 using prior art methods described above, e.g., plating of cobalt followed by chemical-mechanical polishing. Alternatively, cobalt caps can be formed on copper wire interconnects 120 while wafer 80 is mounted to carrier 94. In this latter embodiment, electroless plating solution from source 108 is delivered to polishing pad 100 via delivery system 98. The electroless plating solution is then applied to the exposed surfaces 108 and 122 of dielectric 82 and copper interconnects 120, respectively, as wafer 80 is rotated against polishing pad 100. Slurry from source 109 is applied to the exposed surfaces 108 and 122 simultaneously with the electroless plating solution. Thus, slurry from source 109 and electroless plating solution from source 108 are simultaneously applied as wafer 80 is rotated against polishing pad 100. In this manner, surface 108 of the dielectric is polished while a layer of cobalt is formed on the recessed surfaces 122 of interconnects 120. Any cobalt that forms on surface 108 due to, for example, dielectric surface defects and contamination will be removed by action of the polishing pad 100 and the slurry from source 109, thus preventing the creation of cobalt overhang (see, e.g., FIG. 4B) or cobalt deposits (see, e.g., FIG. 4C) on dielectric surface 102.

Figure 5E:
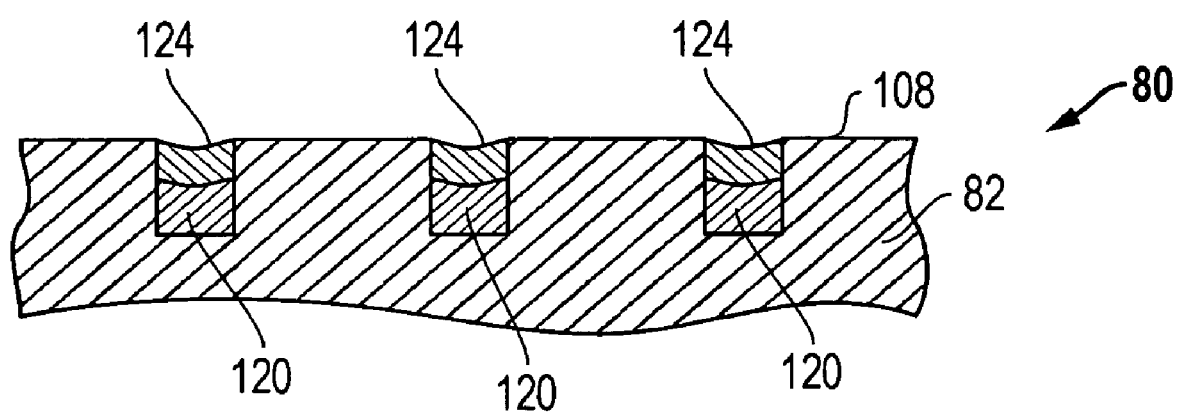
FIG. 5E shows the semiconductor wafer of FIG. 5D after creation of cobalt caps over the copper interconnects.

After a predetermined (e.g., between 1-2 minutes) amount of time, the cobalt deposited on the exposed surface of the copper interconnects 120 via the electroless plating solution, gradually forms caps 124 shown within FIG. 5E. These caps should cover all exposed surfaces 122 of copper interconnects 120. Continued polishing of the wafer 80 prevents the buildup of cobalt on exposed surface 108 of the dielectric 82.

The present invention has been described, in one embodiment, with reference to recessing or further recessing copper interconnects 120 using an acidic solution, followed by the formation of cobalt caps (e.g., caps 124) by (1) applying an electroless plating solution to recessed surfaces of the interconnects 120 and simultaneous chemical-mechanical polishing of the dielectric surface 82, or (2) forming a layer of cobalt over exposed surfaces of dielectric 82 and copper interconnect 120 using, for example, CVD, and subsequently removing the cobalt layer formed on the dielectric surface using conventional chemical-mechanical polishing. It is noted that recessing interconnects 120 by etching with an acidic solution, is not required to form cobalt caps over the copper interconnects. The recesses could be formed by conventional chemical-mechanical polishing, and the cobalt caps could then be formed by applying an electroless plating solution to recessed surfaces of the interconnects 120 and simultaneous chemical-mechanical polishing of dielectric surface 82.

Although the present invention has been described in connection with several embodiments, the invention is not intended to be limited to the specific forms set forth herein. On the contrary, it is intended to cover such alternatives, modifications, and equivalents as can be reasonably included within the scope of the invention as defined by the appended claims.

We claim:

1. A method of forming an integrated circuit, the method comprising:

forming a dielectric layer on a semiconductor wafer;

forming a trench in the dielectric layer;

forming a conductive interconnect within the trench, wherein the conductive interconnect comprises copper;

etching the conductive interconnect using an acidic solution;

simultaneously applying an electroless plating solution and a slurry to the exposed surface of the etched conductive interconnect and an exposed surface of the dielectric layer.

2. The method of claim 1 further comprising polishing the exposed surface of the dielectric layer as the electroless plating solution and the slurry is applied thereto.

3. The method of claim 2 wherein a conductive layer formed on the exposed surface of the etched conductive interconnect remains after polishing the exposed surface of the dielectric.

4. The method of claim 1 further comprising:
- passing the electroless plating solution from a first reservoir to the exposed surface of the etched conductive layer and the exposed surface of the dielectric;
- passing the slurry from a second reservoir to the exposed surface of the etched conductive layer and the exposed surface of the dielectric.

5. The method of claim 1 further comprising forming a conductive layer on an exposed surface of the etched conductive interconnect, wherein forming the conductive layer comprises the act of applying the electroless plating solution and the slurry to the exposed surface of the etched conductive interconnect and the exposed surface of the dielectric layer.

6. A method comprising:
- forming a dielectric layer on a semiconductor wafer;
- forming a trench in the dielectric layer;
- forming a conductive interconnect within the trench, wherein the conductive interconnect comprises copper;
- forming a conductive layer on an exposed surface of the conductive interconnect;
- removing conductive material deposited on an exposed surface of the dielectric;
- wherein the conductive layer is formed on the exposed surface of the conductive interconnect while conductive material is removed from the exposed surface of the dielectric by simultaneously applying an electroless plating solution and a slurry to the exposed surface of the conductive interconnect and an exposed surface of the dielectric layer.

7. The method of claim 6 wherein the act of removing conductive material comprises polishing the exposed surface of the dielectric using a CMP tool.

8. The method of claim 6 further comprising an act of etching the conductive interconnect using an acid solution, wherein the act of etching occurs before formation of the conductive layer.

9. The method of claim 8 further comprising:
- attaching the semiconductor wafer to a wafer carrier of a CMP tool;
- detaching the semiconductor wafer from the wafer carrier;
- wherein the conductive layer is formed on the exposed surface of the conductive interconnect after attaching the semiconductor wafer to the wafer carrier but before detaching the semiconductor wafer from the wafer carrier;
- wherein the conductive material is removed from the exposed surface of the dielectric after attaching the semiconductor wafer to the wafer carrier but before detaching the semiconductor wafer from the wafer carrier;
- wherein the conductive interconnect is etched after attaching the semiconductor wafer to the wafer carrier but before detaching the semiconductor wafer from the wafer carrier.

* * * * *